(12) United States Patent
Ikeda et al.

(10) Patent No.: US 6,299,987 B1
(45) Date of Patent: Oct. 9, 2001

(54) GOLDEN DECORATIVE PART

(75) Inventors: Shinji Ikeda, Tokyo; Ryo Kurakata, Sayama; Shigeyuki Takahashi, Kokubunji, all of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 08/870,883

(22) Filed: Jun. 6, 1997

Related U.S. Application Data

(63) Continuation of application No. 08/538,257, filed on Oct. 3, 1995, now abandoned, which is a continuation of application No. 08/198,528, filed on Feb. 18, 1994, now abandoned.

(30) Foreign Application Priority Data

Feb. 19, 1993 (JP) ................................... 5-030363
Apr. 30, 1993 (JP) ................................... 5-128360

(51) Int. Cl.$^7$ ........................................ B32B 15/04
(52) U.S. Cl. .................... 428/627; 428/628; 428/672; 428/660; 428/681; 428/469; 428/698; 428/699; 420/512
(58) Field of Search .................... 420/512, 507; 428/627, 672, 681, 624, 625, 626, 628, 632, 433, 418, 425.8, 457, 469, 472, 698, 699

(56) References Cited

U.S. PATENT DOCUMENTS

| | | | |
|---|---|---|---|
| 4,252,862 | * | 2/1981 | Nishida ................................ 428/672 |
| 4,403,014 | * | 9/1983 | Bergmann ........................... 428/627 |
| 4,495,254 | * | 1/1985 | Hoffman ............................. 428/632 |
| 4,699,850 | * | 10/1987 | Kishi et al. .......................... 428/627 |
| 4,761,346 | * | 8/1988 | Naik ................................... 428/627 |
| 4,987,038 | * | 1/1991 | Holzer ................................ 428/672 |
| 5,059,255 | * | 10/1991 | Muller ................................ 420/512 |

FOREIGN PATENT DOCUMENTS

| | | | |
|---|---|---|---|
| 0611833 | 8/1994 | (EP) . | |
| 2592063 | 6/1987 | (FR) . | |
| 2130795 | 6/1984 | (GB) . | |
| 2284431 | 7/1995 | (GB) . | |
| 58144443 | 8/1983 | (JP) . | |
| 59-47376 | * 3/1984 | (JP) | ................................. 428/660 |
| 59-140337 | * 8/1984 | (JP) | ................................. 428/672 |
| 63-125656 | * 5/1988 | (JP) | ................................. 428/627 |
| 63143251 | 6/1988 | (JP) . | |
| WO9009463 | 8/1990 | (WO) . | |

OTHER PUBLICATIONS

Latin American Conference on the Applications of the Mossbauer Effect (Lacame '90), Part I; Havana, Cuba; Oct. 29, 1990–Nov. 2, 1990; ISSN 0304–3843; vol. 66; pp. 339–343 (1991).

* cited by examiner

*Primary Examiner*—N. M. Nguyen
(74) *Attorney, Agent, or Firm*—Webb Ziesenheim Logsdon Orkin & Hanson, P.C.

(57) ABSTRACT

The golden decorative part of the present invention comprises a substrate and, formed thereon according to a dry plating process, an outermost coating, which coating comprises gold and titanium or iron together with inevitable ingredients in specific proportions. A Ti coating formed in an inert gas other than nitrogen, containing inevitable ingredients may be disposed on the substrate, and a TiN coating may be disposed on the substrate or the Ti coating. The above golden decorative part having the outermost coating containing titanium does not cause allergic dermatitis, such as contact dermatitis, even if used in contact with the skin, and exhibits a uniform golden tone. Further, the above golden decorative part having the outermost coating containing iron is strikingly less likely to cause allergic dermatitis, such as contact dermatitis, even if used in contact with the skin, and exhibits a uniform golden tone. The golden decorative part having these advantages can be obtained by the process for producing a golden decorative part according to the present invention.

22 Claims, No Drawings

GOLDEN DECORATIVE PART

This application is a continuation of application Ser. No. 08/538,257, filed on Oct. 3, 1995, now abandoned, which in turn is a continuation of application Ser. No. 08/198,528, filed Feb. 18, 1994, now abandoned.

FIELD OF THE INVENTION

The present invention relates to a golden decorative part having no danger of causing dermatitis attributed to allergy to metals, such as contact dermatitis, and to a process for producing the same.

BACKGROUND OF THE INVENTION

Conventionally, the decorative parts, such as a wristwatch band and other wristwatch parts, a finger ring, a necklace and an earring, have been provided with a high quality appearance and an excellent corrosion resistance by composing its outermost layer of a gold coating formed according to a wet or dry plating process. The respective outermost layers of such decorative parts are now increasingly composed of a coating of a gold alloy, such as gold-nickel and gold-palladium alloys, rather than of that of pure gold, because the pure gold coating is so soft as to have less wear resistance, and because the color of the pure gold is not favored due to its extremely deep golden tone and rather there is an inclination that light golden color is preferred.

However, in recent years, a marked increase is observed in the occurrence of allergic dermatitis in which contact dermatitis is caused by the contact of the skin with a decorative part, such as a necklace or an earring, made of a precious metal. Such allergic dermatitis cases are reported with respect to almost all types of metals. Especially, the occurrence of allergic dermatitis attributed to gold-nickel and gold-palladium alloys is described in many reports.

Titanium is a metal for which no allergic dermatitis case has been reported. However, the employment of titanium in an ion plating process to form an outermost coating of the above decorative part has been accompanied by drawbacks such that the tone of the resultant gold-titanium alloy coating is not uniform, and that the coating becomes blackish. Iron is another metal for which allergic dermatitis cases have been extremely rarely reported. However, the employment of iron in an ion plating process to form an outermost coating of the above decorative part has also been accompanied by drawbacks such that the tone of the resultant gold-iron alloy coating is not uniform, and that the coating becomes blackish. Extensive study has been made to find what causes such drawbacks. As a result, it has been found that titanium and iron are so active that large amounts of oxygen, carbon and nitrogen present in an ion plating apparatus are captured into the coating, and that the above drawbacks are caused by such capturing.

As indicated above, there has been a strong demand in the art for the development of a golden decorative part not only having no danger of causing allergic dermatitis, such as contact dermatitis, even if used in contact with the skin but also exhibiting a uniform golden tone.

The present invention has been made with a view toward obviating the above drawbacks of the prior art. Thus it an object of the present invention to provide a golden decorative part not only having no danger of causing allergic dermatitis, such as contact dermatitis, even if used in contact with the skin but also exhibiting a uniform golden tone. It is another object of the present invention to provide a process for producing the above golden decorative part.

SUMMARY OF THE INVENTION

A first golden decorative part according to the present invention comprises a substrate and, formed thereon according to a dry plating process, an outermost coating, wherein the outermost coating comprises 60 to 99 atomic % of gold, 0.5 to 20 atomic % of titanium or iron and 0.5 to 20 atomic % of inevitable ingredients.

Further, a second golden decorative part according to the present invention comprises a substrate, a Ti coating containing inevitable ingredients formed on a surface of the substrate in an inert gas other than nitrogen and an outermost coating formed on the Ti coating according to a dry plating process.

wherein the outermost coating comprises 60 to 99 atomic % of gold, 0.5 to 20 atomic % of titanium or iron and 0.5 to 20 atomic % of inevitable ingredients.

Still further, a third golden decorative part according to the present invention comprises a substrate, a TiN coating formed on a surface of the substrate and an outermost coating formed on the TiN coating according to a dry plating process.

wherein the outermost coating comprises 60 to 99 atomic % of gold, 0.5 to 20 atomic % of titanium or iron and 0.5 to 20 atomic % of inevitable ingredients.

Still further, a fourth golden decorative part according to the present invention comprises a substrate, a Ti coating containing inevitable ingredients formed on a surface of the substrate in an inert gas other than nitrogen, a TiN coating formed on the Ti coating and an outermost coating formed on the TiN coating according to a dry plating process.

wherein the outermost coating comprises 60 to 99 atomic % of gold, 0.5 to 20 atomic % of titanium or iron and 0.5 to 20 atomic % of inevitable ingredients.

A first process for producing a golden decorative part according to the present invention comprises forming an outermost coating comprising 60 to 99 atomic % of gold, 0.5 to 20 atomic % of titanium or iron and 0.5 to 20 atomic % of inevitable ingredients on a substrate in an atmosphere of an inert gas other than nitrogen in a dry plating apparatus.

Further, a second process for producing a golden decorative part according to the present invention comprises evaporating titanium in an atmosphere of an inert gas other than nitrogen in a dry plating apparatus to thereby form a Ti coating containing inevitable ingredients present in the dry plating apparatus on a substrate, and subsequently forming an outermost coating comprising 60 to 99 atomic % of gold, 0.5 to 20 atomic % of titanium or iron and 0.5 to 20 atomic % of inevitable ingredients on the Ti coating in an atmosphere of an inert gas other than nitrogen in the dry plating apparatus.

Still further, a third process for producing a golden decorative part according to the present invention comprises evaporating titanium in an atmosphere of nitrogen gas in a dry plating apparatus to thereby form a TiN coating on a substrate, and subsequently forming an other most coating comprising 60 to 99 atomic % or gold, 0.5 to 20 atomic % of titanium or iron and 0.5 to 20 atomic % of inevitable ingredients on the TiN coating in an atmosphere of an inert gas other than nitrogen in the dry plating apparatus.

Still further, a fourth process for producing a golden decorative part according to the present invention comprises evaporating titanium in an atmosphere of an inert gas other than nitrogen in a dry plating apparatus to thereby form a Ti coating containing inevitable ingredients present in the dry plating apparatus on a substrate.

subsequently evaporating titanium in an atmosphere of nitrogen gas in the dry plating apparatus to thereby form a TiN coating on the Ti coating, and thereafter forming an outermost coating comprising 60 to 99 atomic % of gold, 0.5 to 20 atomic % of titanium or iron and 0.5 to 20 atomic % of inevitable ingredients on the TiN coating in an atmosphere of an inert gas other than nitrogen in the dry plating apparatus.

In the present invention, it is preferred that the above TiN coating be disposed just under the outermost coating of the golden decorative part, and that the Ti coating be disposed on the substrate.

DESCRIPTION OF THE PREFERRED EMBODIMENTS

Hereinbelow, the golden decorative part and the process for producing the same according to the present invention will be illustrated.

First, the golden decorative part of the present invention will be described in detail.

Essentially, the golden decorative part of the present invention comprises a substrate and an outermost coating formed on the substrate by a dry plating process, such as the vacuum evaporation, sputtering or ion plating process, which outermost coating comprises (i) gold and (ii) titanium or iron and (iii) inevitable ingredients in specific proportions.

In the golden decorative part of the present invention, there may be a TiN coating between the substrate and the outermost coating. Particularly, the golden decorative part having the TiN coating is excellent in the adhesion of the outermost coating to the substrate.

Further, in the golden decorative part of the present invention, there may be a Ti coating formed in an inert gas other than nitrogen, such as argon, helium or neon, which coating contains inevitable ingredients (nitrogen, oxygen and carbon) present in the dry plating apparatus, between the substrate and the outermost coating, or between the substrate and the TiN coating.

The material for the substrate for use in the present invention includes metals, plastics and ceramics, depending on purposes of the decorative part.

In the golden decorative part of the present invention, the outermost coating comprises 60 to 99 atomic %, preferably 81.5 to 96.5 atomic % and still preferably 88 to 96.5 atomic % of gold,; 0.5 to 20 atomic %, preferably 2.5 to 7 atomic % and still preferably 3 to 7 atomic % of titanium or iron; and 0.5 to 20 atomic %, preferably 0.5 to 12 atomic % and still preferably 0.5 to 5 atomic % of inevitable ingredients comprised of at least one member selected from the group consisting of oxygen, carbon and nitrogen.

When gold (i) and titanium or iron (ii) together with inevitable ingredients are present in the outermost coating in the above proportions, the adverse effect of the inevitable ingredients on the tone of the coating can be prevented so that a golden decorative part having a uniform golden tone can be obtained. Especially, the amount of inevitable ingredients captured into the outermost coating is markedly less in the golden decorative part having the above Ti coating under the outermost coating than in the golden decorative part having no Ti coating under the outermost coating, because inevitable ingredients present in the dry plating apparatus are captured into the Ti coating at the time of the formation of the Ti coating. Consequently, the tone of the outermost coating becomes more uniform. The golden tone of each of the golden decorative part having the outermost coating comprising 88 to 96.5 atomic % of gold, 3 to 7 atomic % of titanium and 0.5 to 5 atomic % of inevitable ingredients and the golden decorative part having the outermost coating comprising 88 to 96.5 atomic % of gold, 3 to 7 atomic % of iron and 0.5 to 5 atomic % of inevitable ingredients is in the range of from 1N-14 to 2N-18 in terms of Swiss Gold Plating Color Standards. Further, the golden decorative part having a golden tone ranging from 1N-14 to 2N-18 in terms of Swiss Gold Plating Color Standards has a specular gloss exhibiting a golden tone ranging from $L^*(10.0–90.0)$ $a^*(6.0)b^*(3.0)$ to $L^*(10.0–90.0)a^*(1.0)b^*(15.0)$. In the above range $L^*$ represents lightness index in CIE 1976 ($L^*a^*b^*$) color space as defined by Commission Internationale de l'Eclairage (CIE), and each of $a^*$ and $b^*$ represents a chromaticness index. The above golden tone $L^*$, $a^*$ and $b^*$ are measured in accordance with the method for determining a color of an object on 0-degree visual filed XYZ system as specified in the CIE Standards, in which measurement for each specular gloss test specimen is conducted by the use of color difference meter SM-2-SCH (integrating sphere system, measuring method: reflection, measuring aperture: 12 mm) manufactured by Suga Shikenki Co., Ltd.

However, golden decorative parts having respective outermost coatings which comprise either gold, titanium and inevitable ingredients or gold, iron and inevitable ingredients in proportions falling outside the above ranges, may also exhibit a golden tone ranging from 1N-14 to 2N-18.

The golden decorative part of the present invention having the outermost coating composed of gold, titanium and inevitable ingredients does not cause allergic dermatitis, such as contact dermatitis, even if used in contact with the skin. Further, the golden decorative part of the present invention having the outermost coating composed of gold, iron and inevitable ingredients is strikingly less likely to cause allergic dermatitis, such as contact dermatitis, even if used in contact with the skin.

The outermost coating of the golden decorative part of the present invention generally has a thickness of from 0.5 to 0.5 μm, preferably from 0.1 to 0.3 μm.

The thickness of the TiN coating is in the range of from 0.1 to 10 μm, preferably from 0.1 to 2 μm. With respect to the Ti coating in which the content of inevitable ingredients is high, the thickness is in the range of from 0.1 to 0.5 μm, preferably from 0.2 to 0.3 μm or so.

The condition of the surface of the outermost coating of the golden decorative part of the present invention is not particularly limited. It may have specular gloss or matte finish.

Now, the process for producing the golden decorative part according to the present invention will be described.

In a first mode, the golden decorative part comprising the substrate and the outermost coating is produced, for example, by forming and outermost coating comprising 60 to 99 atomic % of gold, 0.5 to 20 atomic % of titanium or iron and 0.5 to 20 % of inevitable ingredients on the substrate in an atmosphere of an inert gas other than nitrogen, such as argon, helium, neon, etc., in a dry plating apparatus.

In a second mode, the golden decorative part comprising the substrate, the Ti coating and the outermost coating is produced by evaporating titanium in an atmosphere of an inert gas other than nitrogen, such as argon, helium or neon, in a dry plating apparatus to thereby form the Ti coating containing inevitable ingredients present in the dry plating apparatus on the substrate, and subsequently forming the outermost coating comprising 60 to 99 atomic % of gold, 0.5 to 20 atomic % of titanium or iron and 0.5 to 20 atomic % of inevitable ingredients on the Ti coating in an atmosphere of an inert gas other than nitrogen in the dry plating apparatus.

In a third mode, the golden decorative part comprising the substrate, the TiN coating and the outermost coating is produced by evaporating titanium in an atmosphere of nitrogen gas in a dry plating apparatus to thereby form the TiN coating on the substrate, and subsequently forming the outermost coating comprising 60 to 99 atomic % of gold, 0.5 to 20 atomic % of titanium or iron and 0.5 to 20 atomic % of inevitable ingredients on the TiN coating in the dry plating apparatus in an atmosphere of an inert gas other than nitrogen.

In a fourth mode, the golden decorative part comprising the substrate, the Ti coating, the TiN coating and the outermost coating is produced by evaporating titanium in an atmosphere of an inert gas other than nitrogen in a dry plating apparatus to thereby form the Ti coating containing inevitable ingredients present in the dry plating apparatus on the substrate, subsequently evaporating titanium in an atmosphere of nitrogen gas in the dry plating apparatus to thereby form the TiN coating on the Ti coating, and thereafter forming the outermost coating comprising 60 to 99 atomic % of gold, 0.5 to 20 atomic % of titanium or iron and 0.5 to 20 atomic % of inevitable ingredients on the TiN coating in the dry plating apparatus in an atmosphere of an inert gas other than nitrogen.

In the present invention, the outermost coating may be formed by any one selected from sputtering, vacuum evaporation and ion plating processes. Of these, the ion plating process if preferred.

Below, the formation of each coating especially the outermost coating of the golden decorative part of the present invention according to the ion plating process will be illustrated.

It is preferred that the substrate, such as a wristwatch band, be previously washed with an organic solvent, etc. The interior of the ion plating apparatus is evacuated to a pressure of from $5 \times 10^{-5}$ to $1.0 \times 10^{-6}$ Torr, preferably from $1.0 \times 10^{-5}$ to $1.0 \times 10^{-6}$ Torr, and subsequently an atmosphere gas is introduced thereinto to a pressure of from $8 \times 10^{-4}$ to $5 \times 10^{-3}$ Torr, preferably from $1.0 \times 10^{-3}$ to $3.0 \times 10^{-3}$ Torr.

The lower the pressure of the interior of the ion plating apparatus before the formation of the coating, the more effectively can the outermost coating having a uniform golden tone be obtained. It is preferred that an evacuation be performed to a pressure of $1 \times 10^{-5}$ Torr or less, preferably $1 \times 10^{-6}$ Torr or less.

This is because as the pressure of the ion plating apparatus becomes lower, the amount of the inevitable ingredients present in the apparatus is decreased, so that the golden tone becomes uniform.

In the present invention, the formation of the TiN coating is preferred from the viewpoint that a desired adhesion is ensured between the outermost coating of gold-titanium alloy or the outermost coating of gold-iron alloy and the substrate. However, the TiN coating may be replaced by a golden color nitride coating, such as a ZrN or HfN coating.

An evaporation source composed of a mixture of gold and titanium or a mixture of gold and iron may be used in the present invention. Alternatively, two evaporation sources, i.e., one composed of gold and the other composed of titanium or iron, and disposed to carry out separate evaporations of gold and titanium or iron.

When an evaporation source composed of a mixture of gold and titanium is used in the present invention, the titanium and the gold are employed in proportions such that the resultant outermost coating comprises 60 to 99 atomic % of gold and 0.5 to 20 atomic % of titanium. In particular, a gold-titanium mixture (gold-titanium alloy) composed of 50 to 70 atomic % of gold and 30 to 50 atomic % of titanium is preferably employed.

When an evaporation source composed of a mixture of gold and iron is used in the present invention, the iron and the gold are employed in proportions such that the resultant outermost coating comprises 60 to 99 atomic % of gold and 0.5 to 20 atomic % of iron. In particular, a gold-iron mixture (gold-iron alloy) composed to 75 to 90 atomic % of gold and 10 to 25 atomic % of iron is preferably employed.

The tone of the outermost coating of the obtained golden decorative part can easily be controlled by controlling the proportion of gold to titanium or iron in the evaporation source as mentioned above.

The golden decorative part of the present invention having an outermost coating comprising gold, titanium and inevitable ingredients does not cause allergic dermatitis, such as contact dermatitis, even if used in contact with the skin, and exhibits a uniform golden tone. Further, the golden decorative part of the present invention having an outermost coating comprising gold, iron and inevitable ingredients is strikingly less likely to cause allergic dermatitis, such as contact dermatitis, even if used in contact with the skin, and exhibits a uniform golden tone. The golden decorative part having a Ti coating under the outermost coating of gold-titanium alloy or the outermost coating of gold-iron alloy exhibits an especially uniform golden tone. In the golden decorative part having a TiN coating, the adhesion of the outermost coating to the substrate is excellent. Of various dry plating processes, the ion plating process is preferred from the viewpoint that the golden decorative part having the outermost coating formed by the ion plating process has excellent wear resistance.

The above advantageous golden decorative part is produced by the process for producing a golden decorative part according to the present invention.

Hereinbelow, the present invention will be described with reference to the following Examples, which should not be construed as limiting the scope of the invention.

EXAMPLE 1

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr. Then, a thermionic filament and a plasma electrode arranged in the apparatus were operated to generate argon plasma. Simultaneously, a voltage of −50 v was applied to the wristwatch case as a substrate, and bombardment cleaning was performed for 10 min.

The introduction of argon gas was halted, and nitrogen gas was introduced into the apparatus to a pressure of $2.0 \times 10^{-3}$ Torr.

A plasma gun disposed in the apparatus was operated to generate plasma, and titanium was evaporated for 10 min, thereby forming a TiN coating having a thickness of 0.5 μm.

Thereafter, the evaporation of titanium and the introduction of nitrogen gas were halted, and the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-titanium mixture composed of 50 atomic % of gold and 50 atomic % of titanium was evaporated until a gold-titanium alloy coating having a thickness of 0.3 μm was formed.

The thus obtained wristwatch case exhibited a uniform golden tone. This golden tone was found to be 1N-14 in terms of Swiss Gold Plating Color Standards. Further, the golden tone of the wristwatch case was L*20, a*1.0 and b*15.0.

The outermost coating of the obtained wristwatch case was analyzed by X-ray photoelectron spectroscopy, and it was found that the outermost coating was composed of 82 atomic % of gold, 6 atomic % of titanium, 1 atomic % of nitrogen, 4 atomic % of oxygen and 7 atomic % of carbon.

This wristwatch case was assembled with other wristwatch parts to obtain a wristwatch. This wristwatch was worn for 90 days, precisely for a total of 1080 hours, but allergic dermatitis did not occur at all.

EXAMPLE 2

A wristwatch case obtained by planishing stainless steel was washed with an organic solvent. The washed wristwatch case was disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and nitrogen gas was introduced into the apparatus to a pressure of $2.0 \times 10^{-3}$ Torr.

A plasma gun disposed in the apparatus was operated to generate plasma, and titanium was evaporated for 10 min, thereby forming a TiN coating having a thickness of 0.5 μm.

Thereafter, the evaporation of titanium and the introduction of nitrogen gas were halted, and the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-iron mixture composed of 75 atomic % of gold and 25 atomic % of iron was evaporated until a gold-iron alloy coating having a thickness of 0.3 μm formed.

The thus obtained wristwatch case exhibited a uniform golden tone. This golden tone was found to be 1N-14 in terms of Swiss Gold Plating Color Standards. Further, the golden tone of the wristwatch was L*20, a*1.0 and b*15.0.

The outermost coating of the obtained wristwatch case was analyzed by X-ray photoelectron spectroscopy, and it was found that the outermost coating was composed of 85 atomic % of gold, 8 atomic % of iron, 1 atomic % of nitrogen, 3 atomic % of oxygen and 3 atomic % of carbon This wristwatch case was assembled with other wristwatch parts to obtain a wristwatch. This wristwatch was worn for 90 days, precisely for a total of 1080 hours, but allergic dermatitis did not occur at all.

EXAMPLE 3

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and titanium was evaporated for 5 min, thereby forming a Ti coating having a thickness of 0.25 μm on the surface of the wristwatch case. The interior of the apparatus was evacuated to a pressure of $1.0 \times 10-5$ Torr. The Ti coating contained minute amounts of nitrogen, oxygen and carbon.

Thereafter, nitrogen gas was introduced into the apparatus to a pressure of $2.0 \times 10^{-3}$ Torr, and the plasma gun disposed in the apparatus was operated to generate plasma. Titanium was evaporated for 10 min to thereby form a TiN coating having a thickness of 0.5 μm on the surface of the Ti coating.

Then argon gas was introduced into the apparatus to a pressure of $1.0 \times 10^{-3}$ Torr, and plasma was generated. A gold-titanium mixture composed of 50 atomic % of gold and 50 atomic % of titanium was evaporated until a gold-titanium alloy coating having a thickness of 0.3 μm was formed.

The thus obtained wristwatch case exhibited a uniform golden tone. This golden tone was found to be 1N-14 in terms of Swiss Gold Plating Color Standards. Further, the golden tone of the wristwatch was L*80, a*1.0 and b*15.0.

The outermost coating of the obtained wristwatch case was analyzed by X-ray photoelectron spectroscopy, and it was found that the outermost coating was composed of 88 atomic % of gold, 6.5 atomic % of titanium, 0.5 atomic % of nitrogen, 2 atomic % of oxygen and 3 atomic % of carbon.

This wristwatch case was assembled with other wristwatch parts to obtain a wristwatch. This wristwatch was worn for 90 days, precisely for a total of 1080 hours, but allergic dermatitis did not occur at all.

EXAMPLE 4

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and titanium was evaporated for 5 min, thereby forming a Ti coating having a thickness of 0.25 μm on the surface of the wristwatch case. The interior of the apparatus was evacuated to a pressure of $1.0 \times 10^{-5}$ Torr. The Ti coating contained minute amounts of nitrogen, oxygen and carbon.

Thereafter, nitrogen gas was introduced into the apparatus to a pressure of $2.0 \times 10^{-3}$ Torr, and the plasma gun disposed in the apparatus was operated to generate plasma. Titanium was evaporated for 10 min to thereby form a TiN coating having a thickness of 0.05 µm on the surface of the Ti coating.

The evaporation of titanium and the introduction of nitrogen gas were halted, and the interior of the apparatus was evacuated to a pressure of $1.0 \times 10^{-5}$ Torr.

Then argon gas was introduced into the apparatus to a pressure of $1.0 \times 10^{-3}$ Torr, and plasma was generated. A gold-iron mixture composed of 75 atomic % of gold and 25 atomic % of iron was evaporated until a gold-iron alloy coating having a thickness of 0.3 µm was formed.

The thus obtained wristwatch case exhibited a uniform golden tone. This golden tone was found to be 1N-14 in terms of Swiss Gold Plating Color Standards. Further, the golden tone of the wristwatch was L*80, a*1.0 and b*15.0.

The outermost coating of the obtained wristwatch case was analyzed by X-ray photoelectron spectroscopy, and it was found that the outermost coating was composed of 87 atomic % of gold, 8.5 atomic % of iron, 0.5 atomic % of nitrogen, 1.5 atomic % of oxygen and 2.5 atomic % of carbon.

This wristwatch case was assembled with other wristwatch parts to obtain a wristwatch. This wristwatch was worn for 90 days, precisely for a total of 1080 hours, but allergic dermatitis did not occur at all.

EXAMPLE 5

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and titanium was evaporated for 5 min, thereby forming a Ti coating having a thickness of 0.25 µm on the surface of the wristwatch case. The interior of the apparatus was evacuated to a pressure of $1.0 \times 10^{-5}$ Torr. The Ti coating contained minute amounts of nitrogen, oxygen and carbon.

Then, argon gas was introduced into the apparatus to a pressure of $1.0 \times 10^{-3}$ Torr, and plasma was generated. A gold-titanium mixture composed of 70 atomic % of gold and 30 atomic % of titanium was evaporated until a gold-titanium alloy coating having a thickness of 0.3 µm was formed.

The thus obtained wristwatch case exhibited a uniform golden tone. This golden tone was found to be 2N-18 in terms of Swiss Gold Plating Color Standards. Further, the golden tone of the wristwatch was L*60, a*6.0 and b*3.0.

The outermost coating of the obtained wristwatch case was analyzed by X-ray photoelectron spectroscopy, and it was found that the outermost coating was composed of 91 atomic % of gold, 2.5 atomic % of titanium, 0.5 atomic % of nitrogen, 2.5 atomic % of oxygen and 3.5 atomic % of carbon.

This wristwatch case was assembled with other wristwatch parts to obtain a wristwatch. This wristwatch was worn for 90 days, precisely for a total of 1080 hours, but allergic dermatitis did not occur at all.

EXAMPLE 6

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0 \times 10^{-5}$ Torr, and argon gas was introduced thereinto to a pressure of $1.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and titanium was evaporated for 5 min, thereby forming a Ti coating having a thickness of 0.25 µm on the surface of the wristwatch case. The interior of the apparatus was evacuated to pressure of $1.0 \times 10^{-5}$ Torr. The Ti coating contained minute amounts of nitrogen, oxygen and carbon.

Then, argon gas was introduced into the apparatus to a pressure of $1.0 \times 10^{-3}$ Torr, and plasma was generated. A gold-iron mixture composed of 90 atomic % of gold and 10 atomic % of iron was evaporated until a gold-iron alloy coating having a thickness of 0.3 µm was formed.

The thus obtained wristwatch case exhibited a uniform golden tone. This golden tone was found to be 2N-18 in terms of Swiss Gold Plating Color Standards. Further, the golden tone of the wristwatch was L*60, a*6.0 and b*3.0.

The outermost coating of the obtained wristwatch case was analyzed by X-ray photoelectron spectroscopy, and it was found that the outermost coating was composed of 91 atomic % of gold, 3.5 atomic % of iron, 0.5 atomic % of nitrogen, 2 atomic % of oxygen and 3 atomic % of carbon.

This wristwatch case was assembled with other wristwatch parts to obtain a wristwatch. This wristwatch was worn for 90 days, precisely for a total of 1080 hours, but allergic dermatitis did not occur at all.

EXAMPLE 7

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0 \times 10^{-6}$ Torr, and argon gas was introduced thereinto to a pressure of $3.0 \times 10^{-3}$ Torr.

Then a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and titanium was evaporated for 5 min, thereby forming a Ti coating having a thickness of 0.25 µm on the surface of the wristwatch case. The interior of the apparatus was evacuated to a pressure of $1.0\times10^{-5}$ Torr. The Ti coating contained minute amounts of nitrogen, oxygen and carbon.

Thereafter, nitrogen gas was introduced into the apparatus to a pressure of $2.0\times10^{-3}$ Torr, and the plasma gun disposed in the apparatus was operated to generate plasma. Titanium was evaporated for 10 min to thereby form a TiN coating having a thickness of 0.5 μm on the surface of the Ti coating.

Then, argon gas was introduced into the apparatus to a pressure of $1.0\times10^{-3}$ Torr, and plasma was generated. A gold-titanium mixture composed of 50 atomic % of gold and 50 atomic % of titanium was evaporated until a gold-titanium alloy coating having a thickness of 0.3 μm was formed.

The thus obtained wristwatch case exhibited a uniform golden tone. This golden tone was found to be 1N-14 in terms of Swiss Gold Plating Color Standards. Further, the golden tone of the wristwatch was L*85, a*1.0 and b*15.0.

The outermost coating of the obtained wristwatch case was analyzed by X-ray photoelectron spectroscopy, and it was found that the outermost coating was composed of 89 atomic % of gold, 7.0 atomic % of titanium, 0.5 atomic % of nitrogen, 1.5 atomic % of oxygen and 2 atomic % of carbon.

This wristwatch case was assembled with other wristwatch parts to obtain a wristwatch. This wristwatch was worn for 90 days, precisely for a total of 1080 hours, but allergic dermatitis did not occur at all.

EXAMPLE 8

A wristwatch case obtained by planishing stainless steel so as to provide a surface having a specular gloss was washed with an organic solvent. The washed wristwatch case was disposed in an ion plating apparatus.

Subsequently, the interior of the apparatus was evacuated to a pressure of $1.0\times10^{-6}$ Torr, and argon gas was introduced thereinto to a pressure of $1.0\times10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and titanium was evaporated for 5 min, thereby forming a Ti coating having a thickness of 0.25 μm on the surface of the wristwatch case. The interior of the apparatus was evacuated to a pressure of $1.0\times10^{-5}$ Torr. The Ti coating contained minute amounts of nitrogen, oxygen and carbon.

Then, argon gas was introduced into the apparatus to a pressure of $1.0\times10^{-3}$ Torr, and plasma was generated. A gold-iron mixture composed of 90 atomic % of gold and 10 atomic % of iron was evaporated until a gold-iron alloy coating having a thickness of 0.3 μm was formed.

The thus obtained wristwatch case exhibited a uniform golden tone. This golden tone was found to be 2N-18 in terms of Swiss Gold Plating Color Standards. Further, the golden tone of the wristwatch was L*70, a*6.0 and b*3.0.

The outermost coating of the obtained wristwatch case was analyzed by X-ray photoelectron spectroscopy, and it was found that the outermost coating was composed of 92 atomic % of gold, 4 atomic % of iron, 0.5 atomic % of nitrogen, 1.5 atomic % of oxygen and 2 atomic % of carbon.

This wristwatch case was assembled with other wristwatch parts to obtain a wristwatch. This wristwatch was worn for 90 days, precisely for a total of 1080 hours, but allergic dermatitis did not occur at all.

What is claimed is:

1. A golden decorative part consisting of:

a substrate; and an outermost coating formed thereon according to a dry plating process comprising evacuating the interior of a plating apparatus to a pressure of $1\times10^{-5}$ to $1\times10^{-5}$ Torr, introducing an inert gas other than nitrogen into the plating apparatus to a pressure of $1\times10^{-3}$ to $3\times10^{-3}$ Torr and evaporating gold and iron in said apparatus, wherein the outermost coating consists essentially of 88 to 96.5 atomic % of gold, 3.0 to 7.0 atomic % of iron, and 0.5 to 5 atomic % of incidental impurities including at least one member selected from the group consisting of nitrogen, oxygen and carbon.

2. A golden decorative part consisting of:

a substrate;

a Ti coating containing incidental impurities including at least one member selected from the group consisting of nitrogen, oxygen and carbon, said Ti coating forming on a surface of said substrate in a dry plating process comprising the steps of evacuating a dry plating apparatus containing said substrate to $1\times10^{-5}$ to $1\times10^{-6}$ Torr, introducing argon gas into said apparatus at $1\times10^{-3}$ to $3\times10^{-3}$ Torr, bombardment cleaning said substrate with said argon gas, and evaporating titanium in said apparatus; and an outermost coating consisting essentially of 88 to 96.5 atomic % of gold, 3.0 to 7.0 atomic % of iron, and 0.5 to 5 atomic % of incidental impurities including at least one member selected from the group consisting of nitrogen, oxygen and carbon, said outermost coating formed on said Ti coating according to a dry plating process comprising the steps of evacuating the interior of said apparatus to a pressure of $1\times10^{-5}$ to $1\times10^{-6}$ Torr, introducing an inert gas other than nitrogen into said apparatus at $1\times10^{-3}$ to 3×10−3 Torr and evaporating gold and iron in said apparatus.

3. A golden decorative part consisting of a substrate;

a TiN coating, said TiN coating formed on a surface of said substrate in a dry plating process comprising the steps of evacuating a dry plating apparatus containing said substrate to $1\times10^{-5}$ to $1\times10^{-6}$ Torr, introducing argon gas into said apparatus at $1\times10^{-3}$ to $3\times10^{-3}$ Torr, bombardment cleaning said substrate with said argon gas, introducing nitrogen into said apparatus and evaporating titanium in said apparatus; and an outermost coating consisting essentially of 88 to 96.5 atomic % of gold, 3.0 to 7.0 atomic % of iron, and 0.5 to 5 atomic % of incidental impurities including at least one member selected from the group consisting of nitrogen, oxygen and carbon, said outermost coating formed on said TiN coating according to a dry plating process comprising the steps of evacuating the interior of said apparatus to a pressure of $1\times10^{-5}$ to $1\times10^{-6}$ Torr, introducing an inert gas other than nitrogen into said apparatus at $1\times10^{-3}$ to $3\times10^{-3}$ Torr and evaporating gold and iron in said apparatus.

4. A golden decorative part consisting of:

a substrate;

a Ti coating containing incidental impurities including at least one member selected from the group consisting of nitrogen, oxygen and carbon, said Ti coating formed on a surface of said substrate in a dry plating process comprising the steps of evacuating a dry plating apparatus containing said substrate to $1\times10^{-5}$ to $1\times10^{-6}$ Torr, introducing argon gas into said apparatus at $1\times10^{-3}$ to $3\times10^{-3}$ Torr, bombardment cleaning said substrate with said argon gas, and evaporating titanium in said apparatus;

a TiN coating, said TiN coating formed on said Ti coating in a dry plating process comprising the steps of evacuating a dry plating apparatus containing said substrate to $1\times10^{-5}$ to $1\times10^{-6}$ Torr, introducing argon gas into said apparatus at $1\times10^{-3}$ to $3\times10^{-3}$ Torr, bombardment cleaning said substrate with said argon gas, introducing nitrogen into said apparatus and evaporating titanium in said apparatus; and an outermost coating consisting essentially of 88 to 96.5 atomic % of gold, 3.0 to 7.0 atomic % of iron, and 0.5 to 5 atomic % of incidental impurities including at least one member selected from the group consisting of nitrogen, oxygen and carbon, said outermost coating formed on said TiN coating according to a dry plating process comprising the steps of evacuating the interior of said apparatus to a pressure of $1\times10^{-5}$ to $1\times10^{-6}$ Torr, introducing an inert gas other than nitrogen into said apparatus at $1\times10^{-3}$ to $3\times10^{-3}$ Torr and evaporating gold and iron in said apparatus.

5. The golden decorative part as claimed in claim 1, wherein the outermost coating is formed according to an ion plating process.

6. The golden decorative part as claimed in claim 2, wherein the outermost coating is formed according to an ion plating process.

7. The golden decorative part as claimed in claim 3, wherein the outermost coating is formed according to an ion plating process.

8. The golden decorative part as claimed in claim 4, wherein the outermost coating is formed according to an ion plating process.

9. The golden decorative part as claimed in claim 1, wherein the amount of incidental impurities is 0.5 to 4 atomic %.

10. The golden decorative part as claimed in claim 2, wherein the amount of incidental impurities is 0.5 to 4 atomic %.

11. The golden decorative part as claimed to claim 3, wherein the amount of incidental impurities is 0.5 to 4 atomic %.

12. The golden decorative part as claimed in claim 4, wherein the amount of incidental impurities is 0.5 to 4 atomic %.

13. A golden decorative part consisting of:

a substrate;

a Ti coating containing incidental impurities including at least one member selected from the group consisting of nitrogen, oxygen and carbon and having a thickness of 0.1 to 0.5 μm, said Ti coating formed on a surface of said substrate in a dry plating process comprising the steps of evacuating a dry plating apparatus containing said substrate to $5\times10^{-5}$ to $1\times10^{-6}$ Torr, introducing argon gas into said apparatus at $1\times10^{-3}$ to $3\times10^{-3}$ Torr, bombardment cleaning said substrate with said argon gas, and evaporating titanium, in said apparatus;

a TiN coating, said TiN coating formed on said Ti coating in a dry plating process comprising the steps of evacuating a dry plating apparatus containing said substrate to $5\times10^{-5}$ to $1\times10^{-6}$ Torr, introducing argon gas into said apparatus at $1\times10^{-3}$ to $3\times10^{-3}$ Torr, bombardment cleaning said substrate with said argon gas, introducing nitrogen into said apparatus and evaporating titanium in said apparatus; and an outermost coating consisting essentially of 88 to 96.5 atomic % of Au, 3.0 to 7.0 atomic % of Fe, and 0.5 to 5 atomic % of incidental impurities including at least one member selected from the group consisting of nitrogen, oxygen an carbon, said outermost coating formed on said TiN coating according to a dry plating process comprising the steps of evacuating the interior of said apparatus to a pressure of $5\times10^{-5}$ to $1\times10^{-6}$ Torr, introducing an inert gas other than nitrogen into said apparatus at $1\times10^{-3}$ To $3\times10^{-3}$ Torr and evaporating gold and iron in said apparatus.

14. A golden decorative part of consisting of:

a substrate;

a Ti coating containing incidental impurities including at least one member selected from the group consisting of nitrogen, oxygen and carbon and having a thickness of 0.1 to 0.5 μm, said Ti coating formed on a surface of said substrate in a dry plating process comprising the steps of evacuating a dry plating apparatus containing said substrate to $5\times10^{-5}$ to $1\times10^{-6}$ Torr, introducing argon gas into said apparatus at $1\times10^{-3}$ to $3\times10^{-3}$ Torr, bombardment cleaning said substrate with said argon gas, and evaporating titanium in said apparatus;

a TiN coating, said TiN coating formed on said Ti coating in a dry plating process comprising the steps of evacuating a dry plating apparatus containing said substrate to $5\times10^{-5}$ to $1\times10^{-6}$ Torr, introducing argon gas into said apparatus at $1\times10^{-3}$ to $3\times10^{-3}$ Torr, bombardment cleaning said substrate with said argon gas, introducing nitrogen into said apparatus and evaporating titanium in said apparatus; and an outermost coating consisting essentially of 88 to 96.5 atomic % of Au, 3.0 to 7.0 atomic % of Fe, and 0.5 to 5 atomic % of incidental impurities including at least one member selected from the group consisting of nitrogen, oxygen and carbon, and having a thickness of 0.05 to 0.5 μm, said outermost coating formed on said TiN coating according to a dry plating process comprising the steps of evacuating the interior of said apparatus to a pressure of $5\times10^{-5}$ to $1\times10^{-6}$ Torr, introducing an inert gas other than nitrogen into said apparatus at $1\times10^{-3}$ to $3\times10^{-3}$ Torr and evaporating gold and iron in said apparatus.

15. The golden decorative part as claimed in claim 13, wherein the amount of incidental impurities is 0.5 to 4 atomic %.

16. The golden decorative part as claimed in claim 14, wherein the amount of incidental impurities is 0.5 to 4 atomic %.

17. A golden decorative part consisting of:

a substrate comprising a stainless steel, a Ti coating containing incidental impurities selected from the group consisting of nitrogen, oxygen and carbon, said Ti coating formed on a surface of the substrate in an inert gas other than nitrogen according to a dry plating process, and an outermost coating formed on the Ti coating according to dry plating process, wherein the outermost coating consists of 88 to 96.5 atomic % of gold, 3.0 to 7.0 atomic % of iron, and 0.5 to 5 atomic % of incidental impurities.

18. A golden decorative part consisting of:

a substrate comprising a stainless steel, a nitride coating formed on a surface of the substrate according to a dry plating process, the nitride being selected from the group consisting of TiN, ZrN and HfN, and an outermost coating formed on the nitride coating according to a dry plating process, wherein the outermost coating consists of 88 to 96.5 atomic % of gold, 3.0 to 7.0 atomic % of iron, and 0.5 to 5 atomic % of incidental impurities.

19. A golden decorative part consisting of:

a substrate comprising a stainless steel, a Ti coating containing incidental impurities selected from the group consisting of nitrogen, oxygen and carbon, said Ti coating formed on a surface of the substrate in an inert gas other than nitrogen according to a dry plating process, a nitride coating formed on a surface of the Ti coating according to a dry plating process, the nitride being selected from the group consisting of TiN, ZrN and HfN, and an outermost coating formed on the nitride coating according to a dry plating process, wherein the outermost coating consists of 88 to 96.5 atomic % of gold, 3.0 to 7.0 atomic % of iron, and 0.5 to 5 atomic % of incidental impurities.

20. The golden decorative part as claimed in claim 17, wherein the outermost coating has a thickness of between 0.05 to 0.5 $\mu$m.

21. The golden decorative part as claimed in claim 18, wherein the Ti coating has a thickness of between 0.1 to 0.5 $\mu$m.

22. The golden decorative part as claimed in claim 19, wherein the TiN coating has a thickness of between 0.1 to 10 $\mu$m.

* * * * *

UNITED STATES PATENT AND TRADEMARK OFFICE
CERTIFICATE OF CORRECTION

PATENT NO.     : 6,299,987 B1
DATED          : October 9, 2001
INVENTOR(S)    : Shinji Ikeda et al.

It is certified that error appears in the above-identified patent and that said Letters Patent is hereby corrected as shown below:

Title page,
Item [56], References Cited, U.S. PATENT DOCUMENTS, insert:
-- 4,820,487     *     4/1989  Antoniazzi ............420/512 --.

Column 4,
Line 42, "from 0.5 to 0.5" should read -- from 0.05 to 0.5 --.
Line 58, "by forming and" should read -- by forming the --.

Column 6,
Line 62, "v" should read -- V --.

Column 7,
Lines 31-21, "writstwatch" should read -- wristwatch --.
Line 55, "0.3 µm formed." should read -- 0.3 µm was formed. --.

Column 8,
Line 22, "1.0x10-5 Torr." should read -- $1.0 \times 10^{-5}$ Torr. --.

Column 10,
Line 28, "to pressure" should read -- to a pressure --.

Column 12,
Line 8, "$1 \times 10^{-5}$ to $1 \times 10^{-5}$" should read -- $1 \times 10^{-5}$ to $1 \times 10^{-6}$ --.
Line 39, "3x10-3 Torr" should read -- $3 \times 10^{-3}$ Torr --.

Column 13,
Line 45, "as claimed to" should read -- as claimed in --.

UNITED STATES PATENT AND TRADEMARK OFFICE
CERTIFICATE OF CORRECTION

PATENT NO. : 6,299,987 B1
DATED : October 9, 2001
INVENTOR(S) : Shinji Ikeda et al.

It is certified that error appears in the above-identified patent and that said Letters Patent is hereby corrected as shown below:

Column 14,
Line 14, "1x10$^{-3}$ To" should read -- 1x10$^{-3}$ to --.
Line 64, "to dry plating" should read -- to a dry plating --.

Signed and Sealed this

Thirteenth Day of August, 2002

Attest:

Attesting Officer

JAMES E. ROGAN
*Director of the United States Patent and Trademark Office*